Jan. 15, 1963 G. N. KLEES 3,074,006

TRANSISTOR CIRCUIT OVERLOAD PROTECTIVE DEVICE

Filed May 20, 1958

2 Sheets-Sheet 1

INVENTOR.
GEORGE N. KLEES
BY John A Duffy
AGENT

INVENTOR.
GEORGE N. KLEES
BY John A. Duffy
AGENT

United States Patent Office 3,074,006
Patented Jan. 15, 1963

3,074,006
TRANSISTOR CIRCUIT OVERLOAD PROTECTIVE DEVICE

George N. Klees, La Habra, Calif., assignor to North American Aviation, Inc.
Filed May 20, 1958, Ser. No. 736,483
3 Claims. (Cl. 323—9)

This invention relates to an overload protection device and more particularly to a circuit for protecting transistor elements in electrical circuitry from overloads in current and voltage.

With the advent of the transistor and other new sensitive electronic elements there has been created a need to provide better overload protection circuits. Conventional methods of overload protection such as thermal devices and circuit breakers have become highly unsatisfactory in circuitry employing transistors because of their relatively long time delay between receiving an overload signal and opening the electrical circuit. A fuse at best is a slow device which provides inadequate protection for transistors. A current in excess of the rating for a given transistor will often seriously damage the transistor before a fuse may operate to cut off the overload current.

Circuits for preventing currents in excess of the rating of semi-conductor devices have been designed to maintain current flow through a load below a predetermined maximum safety value. Such circuits, however, do not provide adequate protection for a transistor in series between a supply and a load, because, for example, in a regulated voltage power supply circuit utilizing a power transistor for supplying current to a load, known circuits for limiting the current in the load still do not prevent an excess of voltage drop and power dissipation from accumulating across the power transistor. In order to fully protect any transistor in series between a source and a load some means must be provided to instantaneously remove the voltage and associated power from the power transistor.

The overload protection circuit of this invention overcomes the disadvantages of prior current protection circuits by providing fast-acting and reliable means responsive to a predetermined maximum current flow in a load to open the supply circuit to the load and maintain an open circuit until the current flow falls below the predetermined level. The circuit effectively removes the source from the load at a predetermined maximum current level. A fast-acting electronic switch employing transistors is employed which automatically opens the circuit upon receipt of a high current signal. The circuit time constant is almost instantaneous and automatically prevents any damage to sensitive transistors in series between a source and a load.

It is therefore an object of this invention to provide an improved overload protection circuit.

It is another object of this invention to provide a circuit for protecting semiconductor devices from overload in current and voltage.

It is still another object of this invention to provide a circuit for protecting transistors from excess power dissipation.

It is a further object of this invention to provide a fast-acting transistor switch for opening a current supply circuit to a transistor when current and voltage characteristics reach a predetermined dangerous level.

Other objects of this invention will become apparent from the following description taken in connection with the accompanying drawings, in which FIG. 1 illustrates a simple current supply circuit utilizing a p-n-p transistor;

In accordance with the preferred form of the present invention, overload protection is provided for a transistor in series between a source and a load by including a current limiting device responsive to current in the load and operative to cutoff the series transistor when the load current reaches a predetermined dangerous level. The transistor in series between the source and the load is initially biased so as to operate in saturation for load currents below a predetermined value and in the active region for other load conditions. During saturation, the transistor has substantially minimum resistance and thus a low voltage drop exists across its collector-emitter circuit. Currents above a predetermined dangerous value cause the transistor to change to the active region creating a substantial impedance across the collector-emitter circuit. This change in impedance provides a signal to a current limiting transistor which operates to cut off the series transistor.

Figure 1:
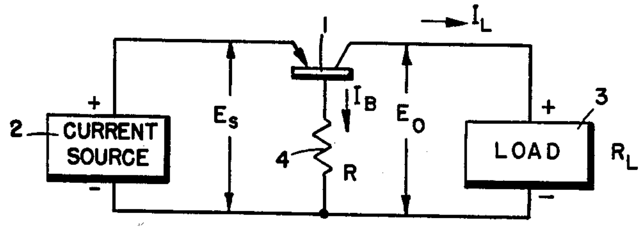
Figure 2:
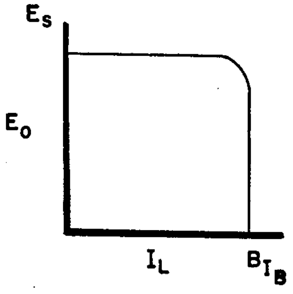
FIG. 2 illustrates the output characteristics of the p-n-p transistor of FIG. 1.

Referring now to FIG. 1, p-n-p transistor 1 is illustrated having emitter, base, and collector electrodes with the emitter-collector circuit connected in series between current source 2 and load 3 designated by $R_L$. The base of transistor 1 is connected through resistor 4 designated as R in common to the negative side of current source 2 and load 3. The input voltage provided by current source 2 across the emitter-base circuit of transistor 1 is designated as $E_s$ and the output voltage across load 3 between the collector and base of transistor 1 is designated as $E_O$. The collector and base currents are defined as $I_L$ and $I_B$ respectively in the direction of current flow as shown. In FIG. 2 there is illustrated the output characteristics of p-n-p transistor 1 connected as shown in FIG. 1. In the circuit of FIG. 1 the base current $I_B$ is approximately equal to $E_s/R$. Transistor 1 will be saturated with a minimum impedance across the emitter-collector for any load current ($I_L$) less than $\beta I_B$ wherein $\beta$ is equal to the current gain between the base and collector. When $I_L$ becomes equal to $\beta I_B$, the transistor is no longer saturated and the output voltage $E_O$ drops sharply as shown in FIG. 2. A drop in the voltage $E_O$ will cause a correspondingly sharp rise in the voltage drop across the emitter-collector circuit of transistor 1. The increase in voltage across the emitter-collector of transistor 1 reduces the current $I_L$ through the load and provides adequate load protection for load 3 but not for transistor 1. If, for example, load 3 should be completely short circuited, the full source voltage $E_s$ will appear across the emitter-collector circuit of transistor 1, thereby causing the transistor to dissipate the entire power provided by the load current and source voltage. The power dissipation required is normally much more than transistor 1, a normal series transistor regulator can stand without serious damage.

Figure 3:
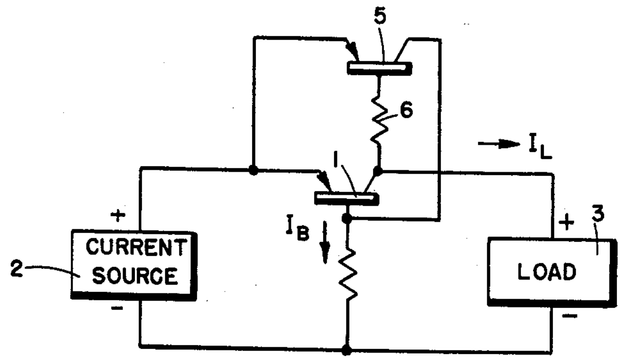
FIG. 3 is a schematic diagram of one embodiment of this invention.

In order to provide adequate protection for series transistor 1, a circuit as shown in FIG. 3 is provided to rapidly decrease the base current $I_B$ in transistor 1 in response to a voltage across the emitter-collector circuit of transistor 1. In FIG. 3 control transistor 5 is provided having its emitter connected in common with the emitter of transistor 1, its collector connected to the base of transistor 1, and its base connected through resistor 6 to the collector of transistor 1. In the circuit of FIG. 3, for load currents less than the predetermined maximum allowable value, transistor 1 is saturated with a substantially zero voltage drop existing across the emitter-collector circuit thereof. The voltage across the emitter-collector of transistor 1 is equal to the voltage across the emitter-base of transistor 5 and provides control for the flow of current through the emitter-collector of transistor 5. Thus, when transistor 1 is saturated, having no voltage across its emitter-collector, transistor 5 is essentially open circuited with zero voltage across its emitter base circuit. When the load current $I_L$ increases to a value greater than the predetermined maximum value, transistor 1 operates in the active region and a voltage appears across the emitter-collector circuit thereof providing a corresponding voltage across the emitter-base circuit of transistor 5. Current commences to flow in the emitter-collector circuit of transistor 5 resulting in a base and collector current in transistor 5. The collector current of transistor 5 connected to the base of transistor 1 reduces the base current $I_B$ in transistor 1 which in turn cumulatively increases the voltage across the emitter-collector of transistor 1. This regenerative action rapidly saturates transistor 5 whose collector current operating on the base of transistor 1 rapidly opens the circuit through transistor 1. Thus, instead of transistor 1 having to dissipate the current source voltage, it is now operating as an open circuit having only to dissipate negligible power due to leakage current in its colector. The circuit in FIG. 3 remains in the off position with no current flowing in the emitter-collector of transistor 1, thereby open circuiting the connection between current source 2 and load 3 until such time as the entire load 3 is removed. Removal of load 3 provides for recycling of the circuit with transistor 1 returning to the saturation conduction region and transistor 5 cut off.

Figure 4:
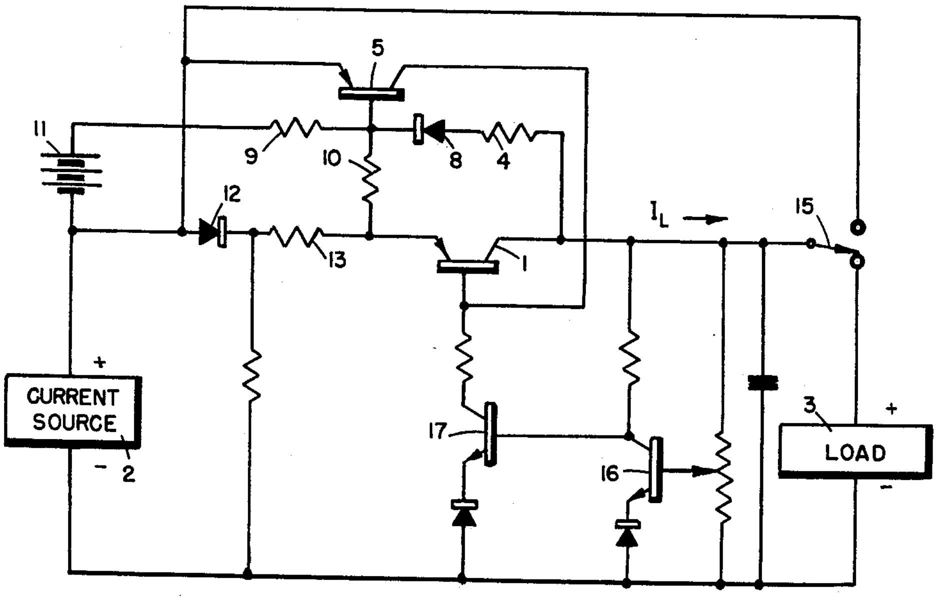
FIG. 4 is a schematic diagram of another embodiment of this invention.

In the embodiment illustrated in FIG. 3, series transistor 1 may be for example the power transistor normally in series between the source and the load of a standard series transistor voltage regulator. The circuit of FIG. 4 illustrates this principle. In FIG. 4 series transistor 1 is protected by the overload protection circuit provided by transistor 5 similar to the manner shown in FIG. 3. The protection circuit of FIG. 3 is modified in FIG. 4 by including a diode 8 in series between resistor 4 and the base of transistor 5. Diode 8 operates to prevent undesirable operation of the cutoff protection circuit for large step changes in load 3. A resistor bridge circuit comprising resistors 9 and 10 is provided to establish initial bias potential characteristics on the base of transistor 5. Auxiliary current source 11 is connected to supply bias current through resistor 9 to the base of transistor 5 and resistor 10 connects the base of transistor 5 to the emitter of transistor 1. Unidirectional diode 12 in series with resistor 13 is inserted between current source 2 and the emitter of transistor 1 to produce a slight predetermined back bias on transistor 1 when transistor 5 is saturated and transistor 1 is open circuited. By properly selecting values for resistors 9, 10, and 13 the load current $I_L$ at which the switching action will take place is very closely controlled. Normally closed switch 15 connected between source 2 and load 3 provides for the resetting of the circuit after transistor 1 has been open circuited by the action of transistor 5. Momentarily activating normally closed switch 15 disconnects source 2 from load 3, thus resetting the circuit. The remainder of the circuitry of FIG. 4 comprises a well-known series regulation circuit such as it shown, for example, in copending application, Serial No. 595,329, entitled Transistorized Voltage Regulated Power Supply. Thus transistor 16 senses changes in voltage across load 3 and provides control through transistor 17 to the base of transistor 1.

In operation with the load current $I_L$ less than the maximum allowed transistor 5 is cut off by the back bias produced by source 11 and resistors 9 and 10. When $I_L$ exceeds the maximum allowed current, a voltage is produced across resistor 13 which is sufficient to overcome the back bias on transistor 5 and forward biases the emitter-base circuit causing conduction in transistor 5 reducing current in the emitter-collector circuit of transistor 1. As the output voltage from source 2 decreases, the zener breakdown voltage of diode 8 is exceeded thereby maintaining a strong forward bias on the emitter-base circuit of transistor 5 insuring the continual conduction of transistor 5 and further reducing the current through transistor 1. When it appears that operation of the circuit may be resumed, switch 15 is momentarily actuated, thus shorting the output of source 2.

The embodiments disclosed in FIGS. 3 and 4 show overload protection circuits as applied to power supplies. Various other applications of the overload protection circuits of FIG. 3 and 4 are readily apparent to one skilled in the art. Transistors 1 and 5 may be n-p-n type transistors with modifications in connections which are well-known in the art and need not be described here. In addition, the circuits of FIG. 3 and 4 may be modified to include transistor 1 connected between the negative terminals of source 2 and load 3.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A current protection circuit comprising a transistor having an emitter, a base, and a collector, said transistor operable in active and saturation regions respectively characterized by high and low impedances, means for connecting a load between said collector and said emitter, means connected between said base and said collector for causing a predetermined flow of current through said base whereby said transistor operates in said saturation region for a predetermined load current and in said active region for current loads greater than said predetermined load current, and means responsive to the impedance of said transistor for decreasing the flow of current through said base when the impedance of said transistor increases.

2. The combination recited in claim 1 wherein said means for decreasing the flow of current in said base comprises a second transistor having emitter, base, and collector electrodes, the emitter-base circuit of said second transistor connected across the emitter-collector circuit of said transistor whereby current through the emitter-collector circuit of said second transistor is proportional to the impedance across the emitter-collector of said transistor, and the collector of said second transistor connected to the base of said transistor.

3. A current limiting circuit for preventing a current source from passing more than a predetermined value of current through a load comprising a first transistor having emitter, base, and collector electrodes, the emitter-collector circuit of said first transistor connected to supply current from said source to said load, means connecting the collector-base circuit of said first transistor across said load whereby current in the base of said first transistor is proportional to the current through said load, and means responsive to the impedance of the emitter-collector circuit of said transistor for decreasing said base current when said impedance increases.

References Cited in the file of this patent

UNITED STATES PATENTS

| | | |
|---|---|---|
| 2,693,568 | Chase | Nov. 2, 1954 |
| 2,716,729 | Schockley | Aug. 30, 1955 |
| 2,832,900 | Ford | Apr. 29, 1958 |
| 2,915,693 | Harrison | Dec. 1, 1959 |
| 2,917,700 | Chase | Dec. 15, 1959 |
| 2,925,548 | Scherer | Feb. 16, 1960 |